United States Patent
Hsu et al.

(10) Patent No.: US 8,052,302 B2
(45) Date of Patent: Nov. 8, 2011

(54) LIGHT-EMITTING DIODE MODULE

(75) Inventors: Tzu-Hui Hsu, Tainan (TW); Yen-Po Yeh, Chiayi (TW)

(73) Assignee: Au Optronics Corporation, Hsinchu (TW)

( * ) Notice: Subject to any disclaimer, the term of this patent is extended or adjusted under 35 U.S.C. 154(b) by 145 days.

(21) Appl. No.: 12/702,300

(22) Filed: Feb. 9, 2010

(65) Prior Publication Data

US 2011/0149569 A1 Jun. 23, 2011

(30) Foreign Application Priority Data

Dec. 23, 2009 (TW) ................................ 98144537 A

(51) Int. Cl.
*F21V 21/00* (2006.01)
(52) U.S. Cl. .......... 362/249.02; 362/249.08; 362/249.04
(58) Field of Classification Search ............. 362/249.02, 362/249.04, 249.08
See application file for complete search history.

(56) References Cited

U.S. PATENT DOCUMENTS

| | | | | |
|---|---|---|---|---|
| 5,416,276 A | * | 5/1995 | Hou et al. | 174/255 |
| 5,648,883 A | * | 7/1997 | Sampei et al. | 360/267.5 |
| 6,356,449 B1 | * | 3/2002 | Sasaki et al. | 361/749 |
| 6,452,754 B1 | | 9/2002 | Mizuta et al. | |
| 6,528,914 B2 | * | 3/2003 | Kloeppel et al. | 310/71 |
| 7,291,795 B2 | * | 11/2007 | Maharshak et al. | 200/292 |
| 7,766,499 B2 | * | 8/2010 | Park et al. | 362/97.3 |
| 7,897,883 B2 | * | 3/2011 | Yang | 174/535 |
| 7,948,770 B2 | * | 5/2011 | Lin et al. | 361/806 |
| 2001/0007526 A1 | * | 7/2001 | Ohkohdo et al. | 362/249 |

\* cited by examiner

*Primary Examiner* — Ali Alavi

(74) *Attorney, Agent, or Firm* — Jianq Chyun IP Office

(57) ABSTRACT

An LED module including an LED light bar and a FPC is provided. The LED light bar includes a circuit board and a plurality of LED devices. The circuit board has a first surface, a second surface, first pins, second pins, and a slot. The LED devices are disposed on the first surface and electrically connected with the first pins. The FPC passes through the slot and is electrically connected with the second pins. The FPC includes a first bonding part, a second bonding part, and a bending part. The first bonding part has a plurality of third pins electrically connected with the second pins and is in contact with the first surface of the circuit board. The second bonding part has a plurality of fourth pins electrically connected with a control board. The bending part connects between the first part and the second part and passes through the slot.

8 Claims, 3 Drawing Sheets

LIGHT-EMITTING DIODE MODULE

CROSS-REFERENCE TO RELATED APPLICATION

This application claims the priority benefit of Taiwan application serial no. 98144537, filed Dec. 23, 2009. The entirety of the above-mentioned patent application is hereby incorporated by reference herein and made a part of specification.

BACKGROUND OF THE INVENTION

1. Field of the Invention

The present invention generally relates to a light-emitting device, and more particularly, to a light-emitting diode module (LED module).

2. Description of Related Art

In recent years, liquid crystal displays (LCDs) are widely adopted to gradually replace a conventional cathode ray tubes (CRTs) display and has become a main stream of displays in the market due to the advantages of a low operation voltage, non-radiation, light weight, small volume occupancy, and so forth. Currently, LCDs are developed towards full-colors, large sizes, high resolution and low costs.

The LCDs are non-self-illuminating. Hence, they require an external light source, such as a backlight unit, to display images. As consciousness of environmental protection raises around the globe, cold cathode fluorescent lamps (CCFLs) used in conventional backlight unit are gradually replaced by light-emitting diode (LED) devices because the LED devices are more friendly to environment. When the LED devices are applied to the backlight unit, the LED devices are usually mounted on a printed circuit board (PCB) so as to form LED light bars. In addition, the LED light bar is electrically connected with a control circuit board through a flexible printed circuit (FPC) generally. It is noted that the PCB is a circuit board having no aperture, opening, hole, notch, or slot that is sufficient to allow the FPC pass through.

Conventionally, the LED light bar and the FPC are electrically connected through pressure bonding process. Since the bonding area is limited, the bonding strength of the LED light bar and the FPC is insufficient to resist external force. Accordingly, poor contact between the LED light bar and peeling-off problem of the FPC are difficult to resolve.

SUMMARY OF THE INVENTION

The present application is directed to an LED module with favorable reliability.

The present application provides a light-emitting diode (LED) module electrically connected with a control circuit board. The LED module includes an LED light bar and a flexible printed circuit (FPC). The LED light bar includes a circuit board and a plurality of light emitting diode devices (LED devices). The circuit board has a first surface, a second surface opposite to the first surface, a plurality of first pins, a plurality of second pins, and a slot. The first pins and the second pins are located on the first surface. The LED devices are disposed on the first surface of the circuit board and electrically connected with the first pins. The FPC passes through the slot and is electrically connected with the second pins. The FPC includes a first bonding part, a second bonding part, and a bending part. The first boning part has a plurality of third pins electrically connected with the second pins. The first bonding part is in contact with the first surface of the circuit board. The second part has a plurality of fourth pins electrically connected with the control circuit board. The bending part is connected between the first bonding part and the second bonding part and passes through the slot.

In an embodiment of the present application, the circuit board includes a rigid printed circuit board.

In an embodiment of the present application, the LED devices include side-view LED devices.

In an embodiment of the present application, the slot is an opening.

In an embodiment of the present application, the slot is a notch extending inwardly from an edge of the circuit board.

In an embodiment of the present application, a width of the slot is substantially greater than a width of the FPC.

In an embodiment of the present application, the second bonding part is in contact with the second surface of the circuit board.

In an embodiment of the present application, the FPC has a third surface and a fourth surface opposite to the third surface, the third pins are located on the third surface, and the fourth surface of the FPC is in contact with the second surface of the circuit board.

Since the circuit board of the LED light bar disclosed in the present application has a slot, possibility of poor contact between the LED light bar and peeling-off problem of the FPC resulted from improper external force can be effectively reduced.

In order to make the aforementioned and other features and advantages of the invention more comprehensible, embodiments accompanying figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
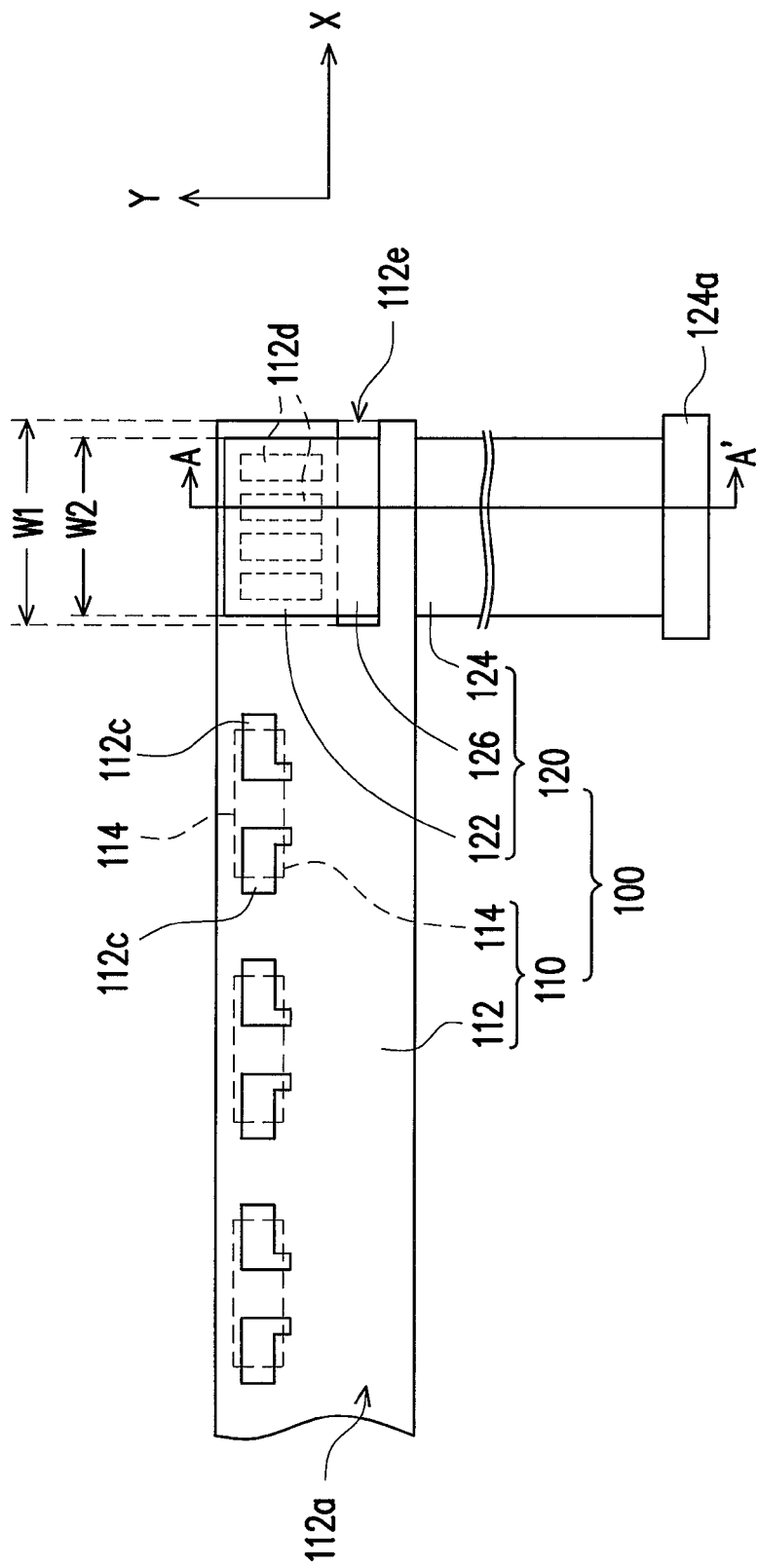
FIG. 1 is a top view illustrating an LED module according to an embodiment of present application.
Figure 2A:
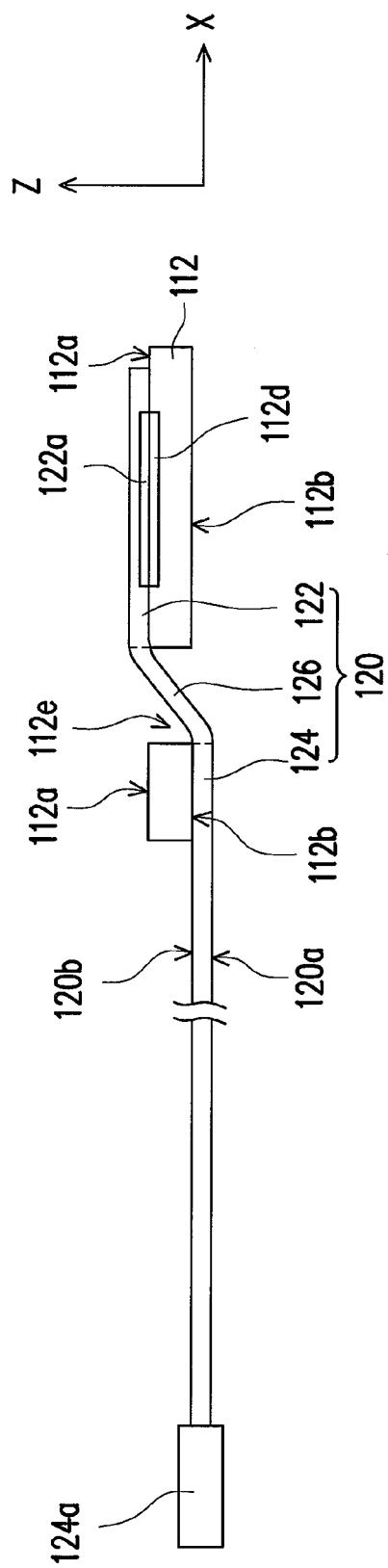
FIG. 2A and FIG. 2B are cross-sectional schematic views along line A-A' in FIG. 1.
Figure 2B:
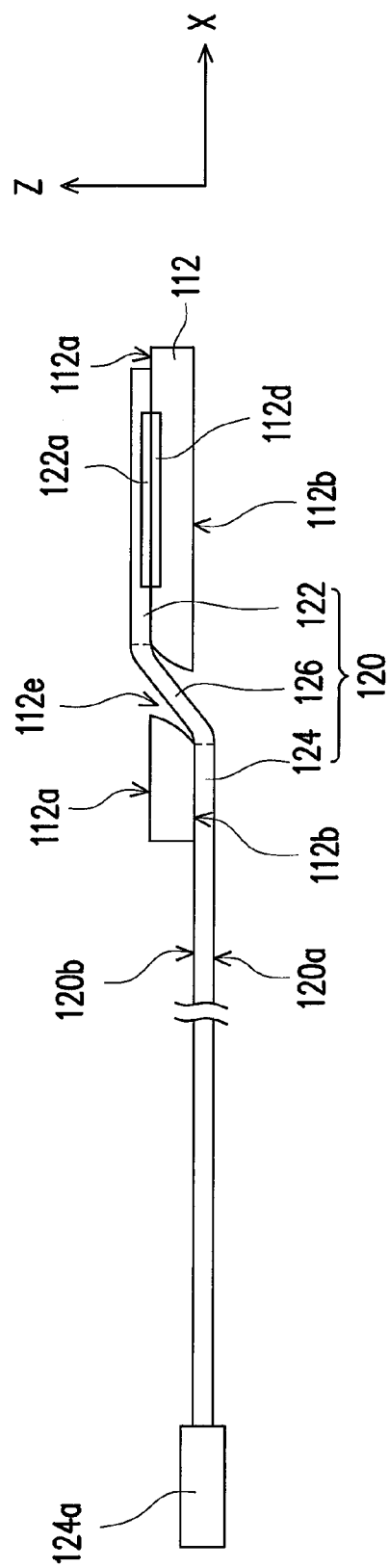

FIG. 1 is a top view illustrating an LED module according to an embodiment of present application. FIG. 2A and FIG. 2B are cross-sectional schematic views along line A-A' in FIG. 1. Referring to FIG. 1 and FIG. 2A, a light-emitting diode (LED) module 100 electrically connected with a control circuit board (not shown) is described in the present embodiment. The LED module 100 includes an LED light bar 110 and a flexible printed circuit (FPC) 120. The LED light bar 110 includes a circuit board 112 and a plurality of LED devices 114. The circuit board 112 has a first surface 112a (i.e. upper surface), a second surface 112b (i.e. lower surface) opposite to the first surface 112a, a plurality of first pins 112c, a plurality of second pins 112d, and a slot 112e. The first pins 112c and the second pins 112d are both located on the first surface 112a. The LED devices 114 are disposed on the first surface 112a of the circuit board 112 and electrically connected with the first pins 112c. The FPC 120 passes through the slot 112e and is electrically connected with the second pins 112d. In other words, the slot is penetrated with both of the first surface 112a of the circuit board 112 and second surface 112b of the circuit board 112. The FPC 120 includes a first bonding part 122, a second bonding part 124, and a bending part 126. The first boning part 122 has a plurality of third pins 122a electrically connected with the second pins 112d. The first bonding part 122 is in contact with the first surface 112a of the circuit board 112. The second part 124 has a plurality of fourth pins 124a electrically connected with the control circuit board (not shown). The bending part 126 is connected between the first bonding part 122 and the second bonding part 124, and the bending part 126 is passes through the slot 112e.

In the present embodiment, the circuit board 112 is a rigid printed circuit board, for example. Generally, the circuit board 112 may be a FR-4 printed circuit board, a FR-5 printed circuit board, a metal-core printed circuit board (MCPCB), and so on. In addition, the first pins 112c and the second pins 112d of the circuit board 112 may be copper pins.

The first pins 112c are electrically connected with the LED devices 114 through solder materials, while the second pins 112d are electrically connected with the third pins 122a through pressure bonding process, for example. In an alternative embodiment, instead of solder materials, the first pins 112c and the LED devices 114 may be electrically connected through direct pressure bonding process or other suitable processes. In addition, the fourth pins 124a may be electrically connected with the control circuit board (not shown) through any possible manners. For example, the fourth pins 124a are fabricated in a connector and the control circuit board (not shown) includes a socket of connector. The fourth pins 124a and the control circuit board (not shown) are electrically connected through assembly of the connector and the socket of connector. In other embodiment of the present application, the fourth pins 124a and the control circuit board (not shown) may be electrically connected through solder materials bonding materials or other suitable processes.

As illustrated in FIG. 1, the slot 112e of the present embodiment is a notch extending inwardly from the edge of the circuit board 112. The width W1 of the slot 112e is substantially greater than the width W2 of the FPC 120, for example. Here, the width W1 of the slot 112e is defined as the dimension of the slot 112e along the X-axis, and the width W2 of the FPC 120 is defined as the dimension of the slot 112e along the X-axis.

In the present embodiment, the LED devices 114 are dot light sources substantially arranged along the X-axis and a linear light source is provided accordingly. Furthermore, each of the LED devices may be a side-view LED device. In other words, light emitted from each of the LED devices 114 substantially propagates along the Y-axis when the LED devices 114 are substantially arranged along the X-axis. In another embodiment, each of the LED devices 114 may be a top-view LED device. In an alternative embodiment, parts of the LED devices 114 are side-view LED devices and another parts of the LED devices 114 are top-view LED devices. When top-view LED devices are used, optical reflectors can be optionally used to reflect light emitted from the top-view LED devices 114, such that upwardly-propagated light emitted from the top-view LED can be transmitted laterally and is resemble side-view device. Furthermore, the materials of light-emitting layer of the LED devices 114 may be organic materials, inorganic materials, combination thereof, or stacked layers thereof. Usually, the LED devices 114 include a substrate, a light-emitting layer formed on the substrate, and encapsulation. The encapsulation covers the light-emitting layer and the substrate such that the light-emitting layer is encapsulated. In another embodiment, a lens for focusing, dispersion, or deflection is optionally formed over the encapsulation.

As illustrated in FIG. 2A, the FPC 120 has a third surface 120a and a fourth surface 120b opposite to the third surface 120a, the third pins 122a are located on the third surface 120a, and the fourth surface 120b of the FPC 120 is in contact with the second surface 112b of the circuit board 112. In addition, the second bonding part 124 is in contact with the second surface 112b of the circuit board 112. In other words, the first bonding part 112 has the third pins 122a located on the lower surface (i.e. the third surface 120a) thereof, the lower surface (i.e. the third surface 120a) of the first bonding part 122 faces the first surface 112a of the circuit board 112, and the third pins 122a of the first bonding part 122 is correspond to the second pins 112d located on the first surface 112a of the circuit board 112. The upper surface (i.e. the fourth surface 120b) of the first bonding part 112 is not electrically connected with other components, wherein the lower surface (i.e. the third surface 120a) and the upper surface (i.e. the fourth surface 120b) are opposite. The second bonding part 124 is connected with an end of the bending part 126 and has an upper surface (i.e. the fourth surface 120b), the upper surface (i.e. the fourth surface 120b) faces the second surface 112b of the circuit board 112. The upper surface (i.e. the fourth surface 120b) of the second bonding part 124 is not electrically connected with other components. In addition, the upper surface (i.e. the fourth surface 120b) of the second bonding part 120 is in contact with and insulated from the second surface 112b of the circuit board 112. The second bonding part 124 further includes a lower surface (i.e. the third surface 120a), wherein the lower surface (i.e. the third surface 120a) is not electrically connected with other components also. The lower surface (i.e. the fourth surface 120b) of the second bonding part 124 and the upper surface (i.e. the third surface 120a) of the second bonding part 124 are opposite.

The movement of the FPC 120 along the Z-axis is limited because the first bonding part 122 of the FPC 120 is located above the circuit board 112, the second bonding part 124 of the FPC 120 is located above the circuit board 112, and the bending part 126 passes through the slot 112e of the circuit board 112. When the FPC 120 suffers from improper external force, since the movement of the FPC 120 along the Z-axis is limited, poor contact between the circuit board 112 and the FPC 120 or peeling-off problem of the FPC 120 can be avoided effectively.

Referring to FIG. 2B, in order to prevent the FPC 120 around the slot 112e from scratching or folding, the slot 112e may have rounding edge.

Figure 3:
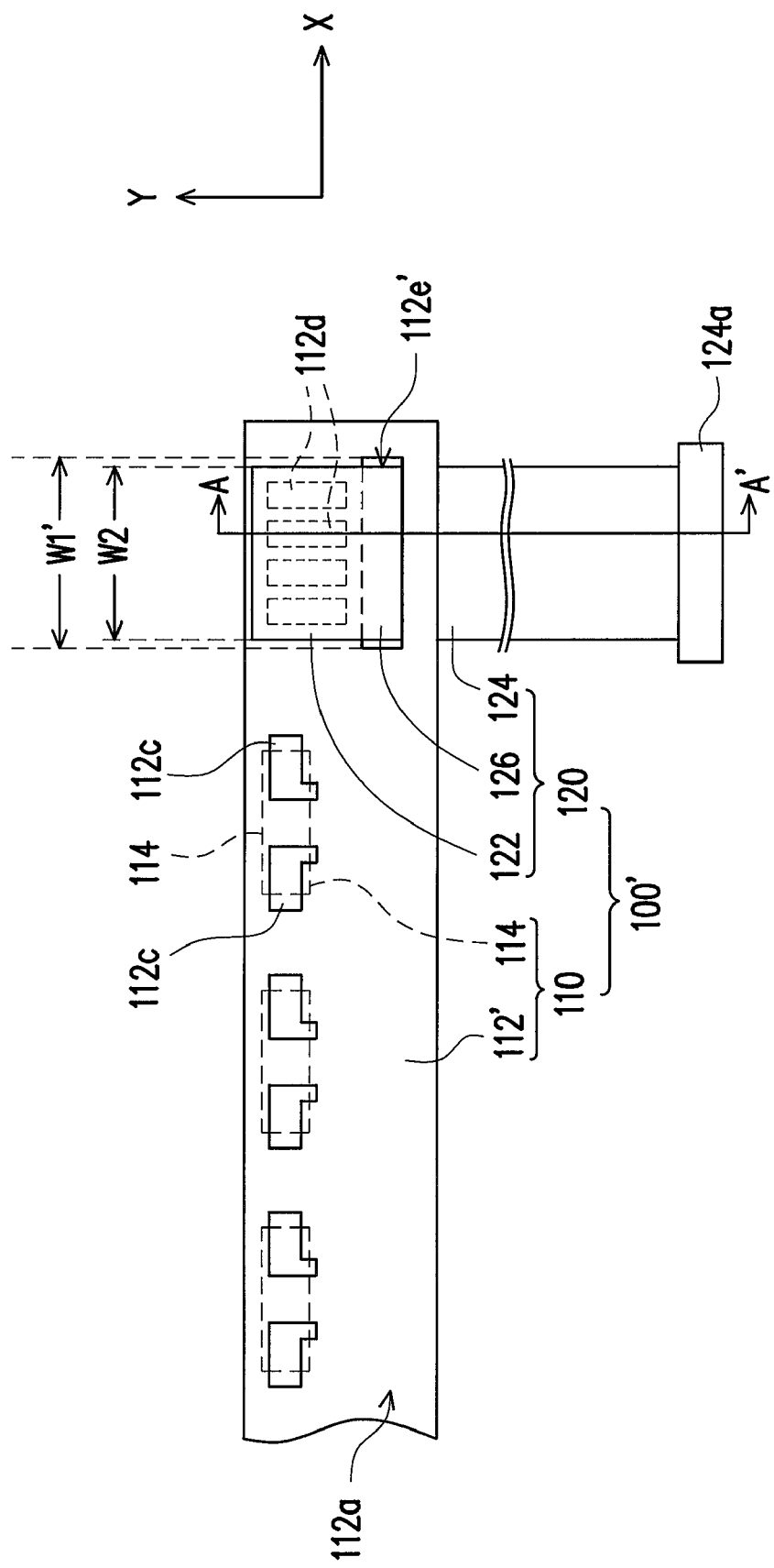
FIG. 3 is a top view illustrating an LED module according to another embodiment of present application.

FIG. 3 is a top view illustrating an LED module according to another embodiment of present application. Referring to FIG. 1 and FIG. 3, the LED module 100' of the present embodiment is similar with the LED module 100 except that the clot 112e' of the circuit board 112' is an opening without extending inwardly from an edge of the circuit board. Similarly, the width W1' of the slot 112e' is substantially greater than the width W2 of the FPC 120, for example.

Furthermore, the shape of the slot (i.e. notch (or namely gap) 112e or opening 112e') may be circular, rectangle, elliptic, rhombic or other polygons. In an embodiment of the present application, the shape of the slot (i.e. notch 112e or opening 112e') is preferably rectangle or elliptic such that layout area on the circuit board 112 can be maximized.

Since the circuit board of the LED light bar disclosed in the present application has a slot, possibility of poor contact between the LED light bar and peeling-off problem of the FPC resulted from improper external force can be effectively reduced.

What is claimed is:

1. A light-emitting diode (LED) module electrically connected with a control circuit board, the LED module comprising:
   an LED light bar, comprising:
      a circuit board having a first surface, a second surface opposite to the first surface, a plurality of first pins, a plurality of second pins, and a slot, the first pins and the second pins being located on the first surface;
      a plurality of LED devices disposed on the first surface of the circuit board and electrically connected with the first pins;
   a flexible printed circuit (FPC), the FPC passing through the slot and being electrically connected with the second pins, and the FPC comprising:
      a first bonding part having a plurality of third pins electrically connected with the second pins, the first bonding part being in contact with the first surface of the circuit board;
      a second part having a plurality of fourth pins electrically connected with the control circuit board; and
      a bending part connected between the first bonding part and the second bonding part and passing through the slot.

2. The LED module according to claim 1, wherein the circuit board comprises a rigid printed circuit board.

3. The LED module according to claim 1, wherein the LED devices comprise side-view LED devices.

4. The LED module according to claim 1, wherein the slot comprises an opening.

5. The LED module according to claim 1, wherein the slot comprises a notch extending inwardly from an edge of the circuit board.

6. The LED module according to claim 1, wherein a width of the slot is substantially greater than a width of the FPC.

7. The LED module according to claim 1, wherein the second bonding part is in contact with the second surface of the circuit board.

8. The LED module according to claim 1, wherein the FPC has a third surface and a fourth surface opposite to the third surface, the third pins are located on the third surface, and the fourth surface of the FPC is in contact with the second surface of the circuit board.

* * * * *